(12) United States Patent
Wang

(10) Patent No.: US 9,369,146 B2
(45) Date of Patent: Jun. 14, 2016

(54) SUCCESSIVE APPROXIMATION REGISTER ANALOG-TO-DIGITAL CONVERTER WITH SINGLE-ENDED MEASUREMENT

(71) Applicant: Silicon Laboratories Inc., Austin, TX (US)

(72) Inventor: Xiaodong Wang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/511,088

(22) Filed: Oct. 9, 2014

(65) Prior Publication Data

US 2015/0091746 A1    Apr. 2, 2015

Related U.S. Application Data

(63) Continuation-in-part of application No. 13/732,113, filed on Dec. 31, 2012, now Pat. No. 8,952,839.

(51) Int. Cl.
*H03M 1/38* (2006.01)
*H03M 1/12* (2006.01)
*H03M 1/00* (2006.01)
*H03M 1/06* (2006.01)
*H03M 1/46* (2006.01)
*H03M 1/80* (2006.01)

(52) U.S. Cl.
CPC .............. *H03M 1/1245* (2013.01); *H03M 1/00* (2013.01); *H03M 1/0695* (2013.01); *H03M 1/12* (2013.01); *H03M 1/1225* (2013.01); *H03M 1/466* (2013.01); *H03M 1/804* (2013.01)

(58) Field of Classification Search
CPC ....... H03M 1/0695; H03M 1/00; H03M 1/12; H03M 1/804

USPC .................. 341/161, 162, 163, 155, 172, 122
See application file for complete search history.

(56) References Cited

U.S. PATENT DOCUMENTS

| | | | |
|---|---|---|---|
| 4,860,232 A | 8/1989 | Lee et al. | |
| 5,394,148 A | 2/1995 | Matsuura et al. | |
| 5,565,813 A | 10/1996 | Connell | |
| 6,686,865 B2 | 2/2004 | Confalonieri et al. | |
| 6,867,724 B2 | 3/2005 | Colonna et al. | |
| 6,977,607 B2 | 12/2005 | Leung et al. | |
| 7,276,962 B1 | 10/2007 | Tomasi | |
| 7,830,295 B2 | 11/2010 | Ikeda et al. | |
| 7,907,074 B2 | 3/2011 | Zanchi et al. | |
| 7,961,132 B1 | 6/2011 | Perry et al. | |
| 7,969,167 B2 | 6/2011 | Khanna et al. | |

(Continued)

OTHER PUBLICATIONS

AY, Suat U., "A sub-1 Volt 10-bit supply boosted SAR ADC design in standard CMOS," Journal of Analog Integrated Circuits and Signal Processing, Feb. 2011, vol. 66, Issue 2, pp. 213-221.

(Continued)

*Primary Examiner* — Joseph Lauture
(74) *Attorney, Agent, or Firm* — Cesari & Reed LLP; R. Micheal Reed

(57) ABSTRACT

A circuit may include a comparator having a first input, a second input, and an output. The circuit further may further include a successive approximation register (SAR) circuit coupled to the output of the comparator, the first input, and the second input. The SAR circuit may be configured to program one or more capacitors to selectively bias the first input to provide a single-ended measurement of a voltage at the second input.

20 Claims, 4 Drawing Sheets

(56) References Cited

U.S. PATENT DOCUMENTS

| | | |
|---|---|---|
| 8,022,856 B2 | 9/2011 | Sakakibara |
| 8,072,360 B2 | 12/2011 | Byrne et al. |
| 8,350,740 B2 | 1/2013 | Akita |
| 8,456,340 B2 | 6/2013 | Kapusta et al. |
| 8,487,795 B1 | 7/2013 | Jiang et al. |
| 8,610,422 B2 | 12/2013 | Figueiredo et al. |
| 2003/0234736 A1 | 12/2003 | Tachibana et al. |
| 2010/0001892 A1 | 1/2010 | Aruga et al. |
| 2010/0259432 A1* | 10/2010 | Ishikawa ............... H03M 1/468 341/144 |
| 2011/0241912 A1 | 10/2011 | Doris et al. |

OTHER PUBLICATIONS

W. Liu, P. Huang, and Y. Chiu, "A 12b 22.5/45Ms/s 3.0mW 0.059mm2 CMOS SAR ADC Achieving Over 90dB SFDR," ISSCC Dig. Tech. Papers, pp. 380-381, Feb. 2010.

* cited by examiner

SUCCESSIVE APPROXIMATION REGISTER ANALOG-TO-DIGITAL CONVERTER WITH SINGLE-ENDED MEASUREMENT

CROSS-REFERENCE TO RELATED APPLICATION(S)

This application is a continuation-in-part of and claims priority to co-pending U.S. patent application Ser. No. 13/732,113 filed on Dec. 31, 2012 and entitled "Successive Approximation Register Analog-to-Digital Converter With Multiple Capacitive Sampling Circuits and Method," which is incorporated herein by reference in its entirety and for all purposes.

FIELD

The present disclosure is generally related to measurement circuits, and more particularly to analog-to-digital converters.

BACKGROUND

An analog-to-digital converter (ADC) is a device for converting an analog signal into a digital code. The ADC samples the analog signal and converts the sampled analog signal into a digital code or digital output signal corresponding to magnitude of the sampled analog signal.

SUMMARY

In certain embodiments, a circuit may include a comparator having a first input, a second input, and an output. The circuit further may further include a successive approximation register (SAR) circuit coupled to the output of the comparator, the first input, and the second input. The SAR circuit may be configured to program one or more capacitors to selectively bias the first input to provide a single-ended measurement of a voltage at the second input.

In other certain embodiments, a method may include, in a first mode, programming a first plurality of capacitors of a feedback digital-to-analog converter (DAC) of a successive approximation register (SAR) coupled to a first input of a comparator. The method may further include receiving a voltage at a second input of the comparator and comparing the voltage at the second input to a signal at the first input using the comparator to produce a digital output signal corresponding to a single-ended measurement of the voltage.

In certain embodiments, the method may further include, in a second mode, programming a second plurality of capacitors of the feedback DAC coupled to the second input of the comparator. The method may further include receiving a voltage at the first input of the comparator and comparing the voltage at the first input to a signal at the second input using the comparator to produce a digital output signal corresponding to a single-ended measurement of the voltage.

In still other certain embodiments, a circuit may include a comparator having a first input, a second input, and an output. The circuit may further include a successive approximation register (SAR) circuit coupled to the output of the comparator. The SAR circuit may be configured to program one or more capacitors of a feedback digital-to-analog converter (DAC) coupled to at least one of the first input and the second input to selectively provide a single-ended measurement mode.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

In the following detailed description of embodiments, reference is made to the accompanying drawings which form a part hereof, and which are shown by way of illustrations. It is to be understood that features of various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented by a circuit that may be controlled by a controller, such as a microcontroller unit, a field programmable gate array (FPGA), a processor, or other circuitry. In accordance with various embodiments, the timing and control of various circuit components may be determined by the controller based on one or more software programs or processor executable instructions executing on the controller.

In certain embodiments, analog-to-digital converter (ADC) circuits and methods described below may provide an ADC measurement of a differential signal or a single-ended signal. In certain embodiments, the ADC circuits and methods may be configured to provide a single-ended ADC measurement on either positive input or a negative input without adding extra analog multiplexers and without sacrificing input-range. Further, in certain embodiments, the ADC circuits and methods may provide single-ended measurements while maintaining the signal-to-noise ratio (SNR). In certain embodiments, the circuits and methods may improve an SAR ADC's single-ended measurement capability without reducing input path speed, without increasing cross-coupling and without reducing the SNR.

In certain embodiments, the ADC circuits and methods may achieve an efficient ADC single-ended measurement on either the positive input or the negative input by re-programming the reset value of the feedback DAC in the SAR ADC, without adding analog complexity, to provide an expanded single-ended capability. In certain embodiments, the SAR ADC may include an inverter on a negative side of a comparator input in a single-ended measurement to make the expanded single-ended measurement capability transparent to the end user. Furthermore, the ADC circuits and methods may maintain a full-scale range and the SNR of a differential ADC. An example of an SAR ADC circuit is described below according to certain embodiments.

Figure 1:
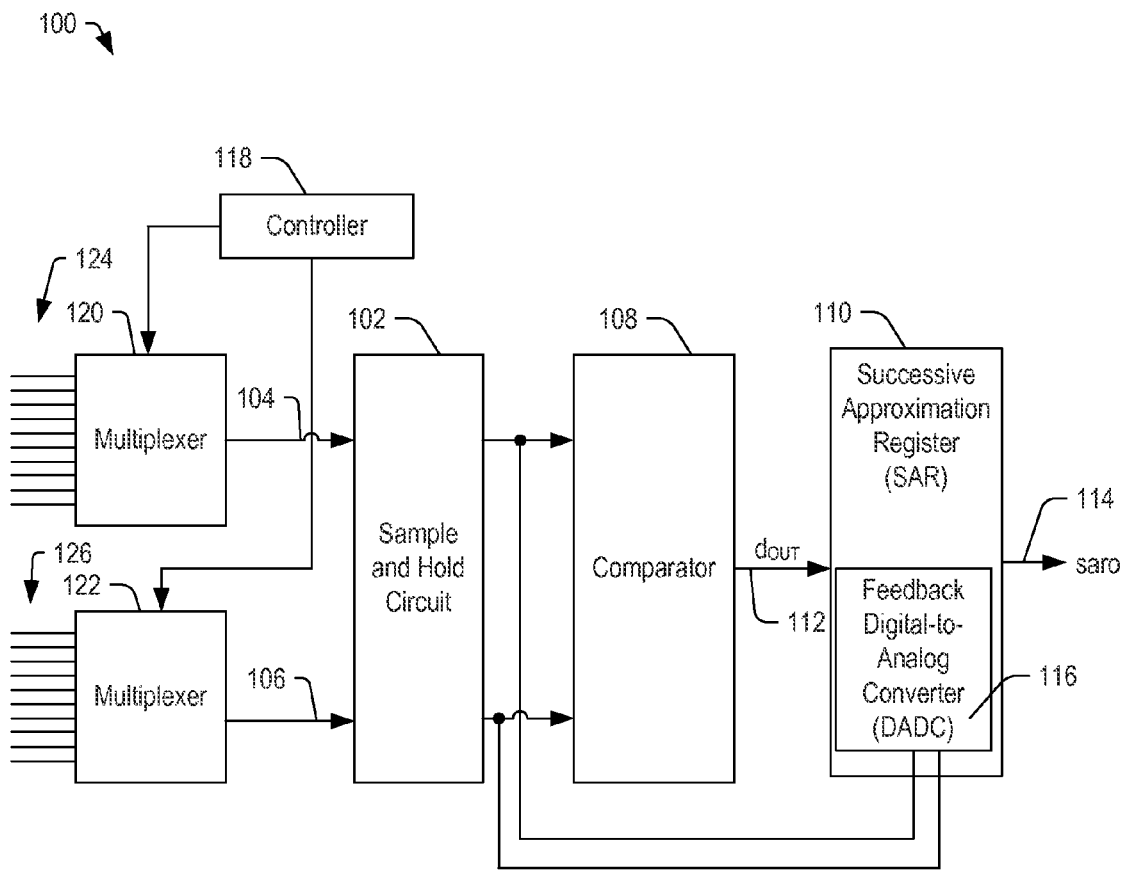
FIG. 1 is a block diagram of a successive approximation register (SAR) ADC according to certain embodiments.

FIG. 1 is a block diagram of a SAR ADC 100 according to certain embodiments. The SAR ADC 100 may include a sample and hold circuit 102 including a first input 104 and a second input 106. The sample and hold circuit 102 may include outputs coupled to first and second inputs of a comparator 108. The comparator 108 may provide a digital output ($d_{OUT}$) to an output 112, which may be coupled to an input of an SAR 110 including a built-in feedback digital-to-analog converter (DAC) 116. The SAR 110 may include an output 114 to provide a digital output signal (saro).

In certain embodiments, during a sample phase, the sample and hold circuit 102 may be decoupled from the comparator 108 and may be coupled to the inputs 104 and 106 to sample a voltage at the inputs onto one or more storage capacitors. During a hold phase, the sample and hold circuit 102 may be decoupled from the inputs 104 and 106 and may be coupled to the inputs of the comparator 108, which may produce a digital output signal ($d_{OUT}$) on the output 112. The SAR 110 may produce an SAR output signal (saro) at the output 114 in response to the digital output signal ($d_{OUT}$) from the comparator 108. Further, the built-in DAC 116 may provide capacitive feedback to the inputs of the comparator 108.

In certain embodiments, the SAR ADC 100 may be configured to provide measurements of a single-ended input. The SAR ADC 100 may include a multiplexer 120 having multiple inputs 124 and an output coupled to the input 104. The SAR ADC 100 may further include a multiplexer 122 having multiple inputs 126 and an output coupled to the input 106. In certain embodiments, the SAR ADC 100 may include a controller 118, which may be configured to control the multiplexer 120 to selectively provide a signal from one of the inputs 124 to the input 104 and to control the multiplexer 122 to selectively provide a signal from one of the inputs 126 to the input 106. In certain embodiments, the controller 118 may also control timing of the activation of switches within the sample and hold circuit 102. In certain embodiments, the controller 118 may be a microcontroller unit, a field programmable gate array (FPGA), a processor, or other circuitry that may be configured to control the multiplexers 120 and 122 and optionally switches within the sample and hold circuit 102.

In certain embodiments, the controller 118 may control the multiplexer 120 to provide a selected signal from inputs 124 to the input 104. The controller 118 may also control the sample and hold circuit 102 to sample the selected signal by controlling one or more switches to provide the signal from the input 104 to at least one capacitor coupled to the input 104. The controller 118 may control one or more switches of the sample and hold circuit 102 to couple a selected voltage (such as a reference voltage or ground) to a capacitor that is coupled to the input 106. The controller 118 may control the sample and hold circuit 102 to provide the sampled voltage from the input 104 and the selected voltage to the comparator 108. The comparator 108 may produce a digital output signal ($d_{OUT}$) at the output 112 in response to the voltages at its inputs. The SAR DAC 110 may receive the digital output signal ($d_{OUT}$) from the output 112 and may produce an SAR output signal (saro) at the output 114 in response thereto. In certain embodiments, the controller 116, the sample and hold circuit 102, or any combination thereof, may be responsive to feedback signals from the SAR DAC 110. In certain embodiments, the controller 116 may be part of the SAR DAC 110.

In certain embodiments, the SAR ADC 100 may perform differential ADC measurements. In certain embodiments, the SAR ADC 100 may perform single-ended ADC measurements on either positive or negative inputs without adding extra analog multiplexers. Further, in certain embodiments, single-ended measurements may be performed across a full-input range (such as the same input range as the differential measurements) and without reducing the signal-to-noise ratio (SNR). In certain embodiments, a single-ended ADC measurement on either positive or negative input may be achieved by re-programing the built-in feedback DAC 116 of the SAR DAC 110 without adding analog complexity. The feedback DAC 116 may have a reset value that can be digitally programmed to provide the expanded single-ended capability. In certain embodiments, the inverter 262 on a negative side single-ended measurement result may make the extra single-ended measurement capability transparent to the end user. Furthermore, the full-scale measurement range and the SNR of the SAR ADC 100 can be maintained for differential or single-ended measurements.

In certain embodiments, multiplexers, such as the multiplexer 120 and the multiplexer 122 may be coupled to the input 104 and the input 106, respectively, to provide a signal to a selected input.

Figure 2:
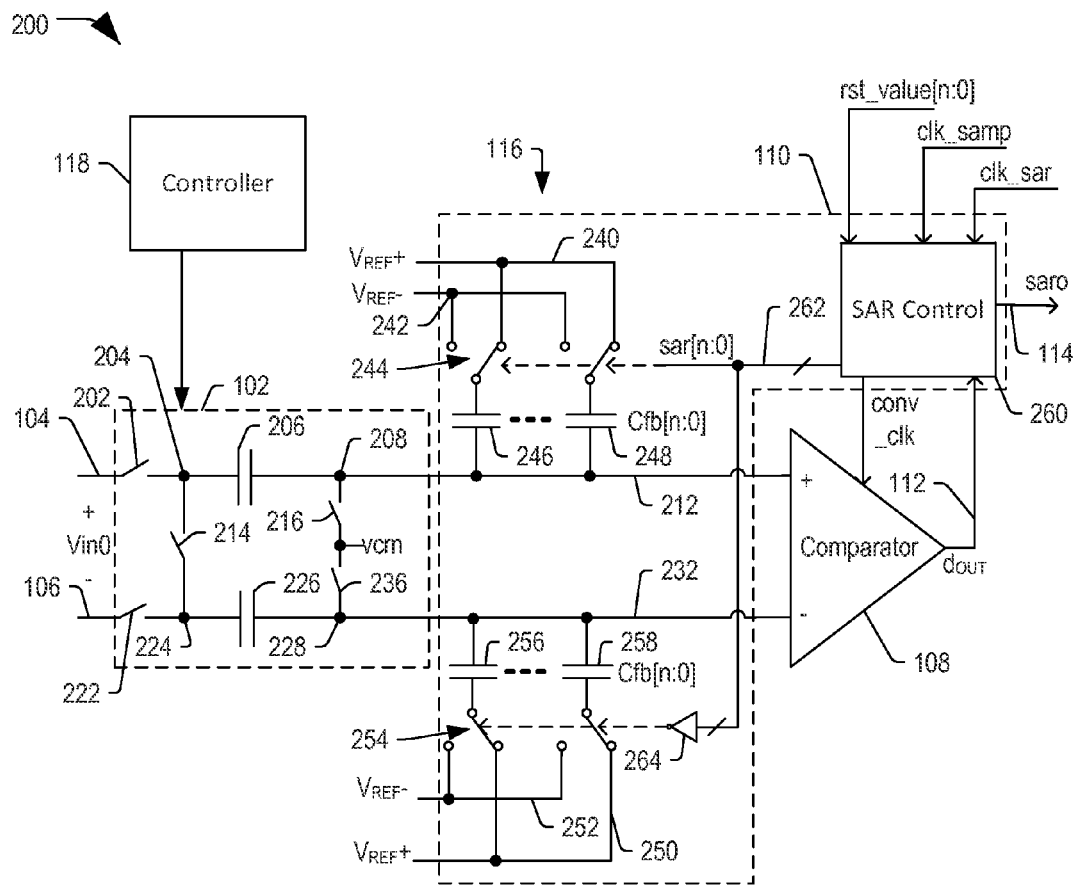
FIG. 2 is a diagram of an SAR ADC according to certain embodiments.

FIG. 2 is a diagram of an SAR ADC 200 according to certain embodiments. The SAR ADC 200 may include all of the elements of the SAR ADC 100 of FIG. 1. The SAR ADC 200 may include the sample and hold circuit 102 including an input 104 and an input 106. The sample and hold circuit 102 may include a switch 202 coupled between the input 104 and a node 204. The sample and hold circuit 102 may also include a capacitor 206 coupled between the node 204 and a node 208. The sample and hold circuit 102 may further include a switch 210 coupled between the node 208 and a node 212. The sample and hold circuit 102 may further include a switch 222 coupled between the input 106 and a node 224. The sample and hold circuit 102 may also include a switch 214 coupled between the node 204 and the node 224. The sample and hold circuit 102 may also include a capacitor 226 coupled between the node 224 and a node 228. The sample and hold circuit 102 may further include a switch 230 coupled between the node 228 and a node 232. The sample and hold circuit 102 may also include a switch 216 coupled between the node 208 and a common mode voltage ($V_{CM}$) node, and a switch 236 coupled between the node 228 and the common mode voltage node ($V_{CM}$).

The SAR ADC 200 may include the comparator circuit 108 including a first input coupled to the node 212, a second input coupled to the node 232, a control input coupled to an SAR control circuit 218 of the SAR DAC 110, and the output 112, which may be coupled to the SAR control circuit 218.

The SAR ADC 200 may further include a built-in feedback DAC 116, which may be part of the SAR DAC 110. The DAC 116 may include a plurality of switches, generally indicated at 244, which may be configured by a control signal applied to a control bus 262 by SAR control circuit 260 to selectively couple capacitors, such as capacitor 246 and capacitor 248, to a selected one of nodes 240 and 242. The node 240 may be configured to provide a first voltage (such as a positive reference voltage ($V_{REF}+$)) to the capacitors 246 and 248 via the switches 244, and the node 242 may be configured to provide a second voltage (such as a negative reference voltage ($V_{REF}-$)) to the capacitors 246 and 248 via the switches 244. The DAC 116 may also include a plurality of switches, generally indicated at 254, which may be configured by the control signal applied to a control bus 262 by SAR control circuit 260 and inverted by inverter 264 to selectively couple capacitors, such as capacitor 256 and capacitor 258, to a selected one of nodes 250 and 252. The node 250 may be configured to provide the first voltage (such as a positive reference voltage ($V_{REF}+$)) to the capacitors 256 and 258 via the switches 254, and the node 252 may be configured to provide the second voltage (such as a negative reference voltage ($V_{REF}-$)) to the capacitors 256 and 258 via the switches 254.

In operation, in a differential sampling phase, the switches 202, 222, 216 and 236 are closed, and switch 214 is opened. Further, the SAR switch control signal (sar[n:0]) on the control bus 262 controls the switches 244 and 254 to provide an equivalent of half of the reference voltage ($V_{REF}/2$) on the $V_{REF}$-side terminals of capacitors 246, 248, 256, and 258. The charge stored by the capacitor 206 can be determined according to the following equation:

$$Q_{C206} = C_{206} * (V_{CM} - V_{IN+}) \quad (1)$$

The charge stored on the capacitor 226 can be determined according to the following equation:

$$Q_{C226} = C_{226} * (V_{CM} - V_{IN-}) \quad (2)$$

The charges ($Q_{fb}$) stored by the capacitors 246, 248, 256, and 258, which are coupled to the nodes 212 and 232 can be determined according to the following equation:

$$Qfb+ = Q_{fb-} = C_{fb_{sum}} * \left(V_{CM} - \frac{V_{REF}}{2}\right) \quad (3)$$

where the charge ($Q_{fb+}$) refers to the charge on the node 212 and the charge ($Q_{fb-}$) refers to the charge on node 232.

At the beginning of a conversion phase, the switches 202 and 222 on the input side and the switches 216 and 236 on the amplifier side are opened. Further, the switch 214 is closed. SAR switch control signal (sar[n:0]) controls the switches 244 and 254 to maintain the equivalent of half of the reference voltage ($V_{REF}/2$) on the $V_{REF}$-side terminals of feedback capacitors 246, 248, 256, and 258. The charge at the comparator input side of capacitor 206 can be determined according to the following equation:

$$Q_{C206} = C_{206} * \left(V_{Node_{212}} - \frac{V_{IN+} + V_{IN-}}{2}\right) \quad (4)$$

The charge at the comparator input side of capacitor 226 can be determined according to the following equation:

$$Q_{C226} = C_{226} * \left(V_{Node_{232}} - \frac{V_{IN+} + V_{IN-}}{2}\right) \quad (5)$$

The charge at the side of feedback capacitors 246 and 248 coupled to the positive input of comparator 108 can be determined according to the following equation:

$$Q_{fb+} = C_{fb_{sum}} * \left(V_{Node_{212}} - \frac{V_{REF}}{2}\right) \quad (6)$$

The charge at the side of feedback capacitors 154 and 158 coupled to the negative input of comparator 132 can be determined according to the following equation:

$$Q_{fb-} = C_{fb_{sum}} * \left(V_{Node_{232}} - \frac{V_{REF}}{2}\right) \quad (7)$$

In operation, the charge is conserved at the comparator input (i.e., $Q_{comp\_input+} = Q_{C206} + Q_{fb+}$; and $Q_{comp\_input-} = Q_{C226} + Q_{fb-}$). Charge is conserved because the capacitors 206 and 226 and on feedback capacitors 246, 248, 256, and 258 store the charge during both the sampling and conversion phases of the ADC. In other words, the charges at the inputs of the comparator 108 are the same during the sampling phase and conversion phase. By evaluating the equations, the voltage at the positive input of comparator 108 may be determined according to the following equation:

$$V_{CMP+} = V_{CM} - \frac{\frac{V_{IN+} - V_{IN-}}{2}}{1 + \frac{C_{fb_{sum}}}{C_{102}}} \quad (8)$$

The voltage at the negative input of comparator 132 may be determined according to the following equation:

$$V_{CMP-} = V_{CM} + \frac{\frac{V_{IN+} - V_{IN-}}{2}}{1 + \frac{C_{fb_{sum}}}{C_{102}}} \quad (9)$$

Thus, the common-mode of the comparator voltage ($V_{CMP}$) is constant at $V_{CM}$ from sampling phase to conversion phase, and the rejection to the input common-mode variation may be improved.

The charge on the feedback capacitors (246 and 248) at the sampling phase is determined according to the following equation:

$$Q_{fb+} C_{fb sum} * (V_{CM} - 0) \quad (10)$$

The charge on the feedback capacitors (256 and 258) at the sampling phase is determined according to the following equation:

$$Q_{fb-} = C_{fb sum} * (V_{CM} - V_{REF})$$

The SAR control signal (sar_cd[n:0]) is changed to the normal configuration at the beginning of conversion phase. A similar charge analysis as discussed above, the voltage at the positive input node 212 of the comparator 108 is determined according to the following equation:

$$V_{CMP+} = V_{CM} - \frac{\left(\frac{V_{IN+} - V_{IN-} - \frac{V_{REF} * C_{fb sum}}{C_{102}}}{2}\right)}{1 + \frac{C_{fb sum}}{C_{102}}} \quad (12)$$

The voltage at the negative input node 232 of the comparator 108 may be determined according to the following equation:

$$V_{CMP-} = V_{CM} + \frac{\left(\frac{V_{IN+} - V_{IN-} - \frac{V_{REF} * C_{fb sum}}{C_{102}}}{2}\right)}{1 + \frac{C_{fb sum}}{C_{102}}} \quad (13)$$

This is equivalent of shifting the single-ended input down by a ratio of the reference voltage multiplied by the sum of the feedback capacitances divided by the total capacitance of the capacitive sampling circuit ($C_{102}$)

$$\left(\text{i.e., } \frac{V_{REF} * 2 * C_{fb sum}}{C_{102}}\right),$$

and shifting the full-scale range of the single-ended input can be recovered as a range from 0 to twice the above value, i.e., $$\frac{V_{REF} * 2 * C_{fbsum}}{C_{102}}.$$

It should be noted that the described shifting technique can also be used to shift the input range by any arbitrary value between the voltage rails (i.e., $V_{REF-}<=X<=V_{REF+}$) to address input ranges that are not centered at zero, either differential or single-ended. Thus, the charges on feedback capacitors 246, 248, 256, and 258 may be configured to level-shift the signal to re-center the signal or to otherwise adjust the signal according to a selected value. Further, as discussed below, a single-ended SAR ADC may be provided that can measure input values across the entire input range of values by applying a selected voltage to one of the input nodes 212 and 232 of the comparator 108.

In certain embodiments, during a sample phase, a signal is provided to one of the inputs 104 and 106. For illustrative purposes, a sampled version of the signal may be provided by the capacitor 206 to the positive input of the comparator 108 via the node 212. The SAR control circuit 260 may control the switches 254 to couple the capacitors 256 and 258 to a selected reference voltage, such as $V_{REF-}$, which may be a voltage that is lower than the other reference voltage ($V_{REF+}$). By applying the selected reference voltage to the capacitors 256 and 258 during the sampling phase, the feedback DAC 116 may be digitally programmed (via the digital control word sar[n:0]) to provide the expanded single-ended capability. In certain embodiments, the charge provided to the capacitors 256 and 258 may operate to adjust the reset value of the feedback DAC 116. The inverter 264 inverts the control word on the negative input side of the comparator 108 to selectively close the switches 254 to apply a selected voltage to the capacitors 256 and 258, to adjust the reset value, providing a full-scale range.

In certain embodiments, the capacitors 246, 248, 256, and 258 represent only four of a plurality of capacitors of the feedback DAC 116. The control word provided by the SAR control 260 on the bus 262 may configure the pluralities of switches 244 and 254 to selectively couple the capacitors 246 and 248 to a selected one of the nodes 240 and 242 and to selectively couple the capacitors 256 and 258 to a selected one of the nodes 250 and 252.

In certain embodiments, when the input signal from the capacitor 226 is sampled and provided to the negative input (input node 232) of the comparator 108 in a single-ended mode, the SAR control circuit 260 may control switches 242 and 244 to selectively couple the capacitors 246 and 248 to a positive reference voltage ($V_{REF+}$). By selectively coupling the capacitors 246 and 248 to the positive reference voltage, the reset value of the comparator 108 may be adjusted to achieve the full-scale range of measurement.

In the above-described circuits, the feedback DAC 116 may be digitally programmed to provide a differential measurement capability in a first mode, a positive-input single-ended measurement capability in a second mode, and a negative-input single-ended measurement capability in a third mode. In certain embodiments, the first, second, and third modes may be selected by the SAR control circuit 260 in response to the selection of the input 104, the input 106, or both for sampling. In certain embodiments, the SAR control circuit 260 may control the feedback DAC 116 during the sampling phase to apply a selected charge to the capacitors 246, 248, 256, and 258 to achieve a desired measurement range as discussed below with respect to FIG. 3.

Figure 3:
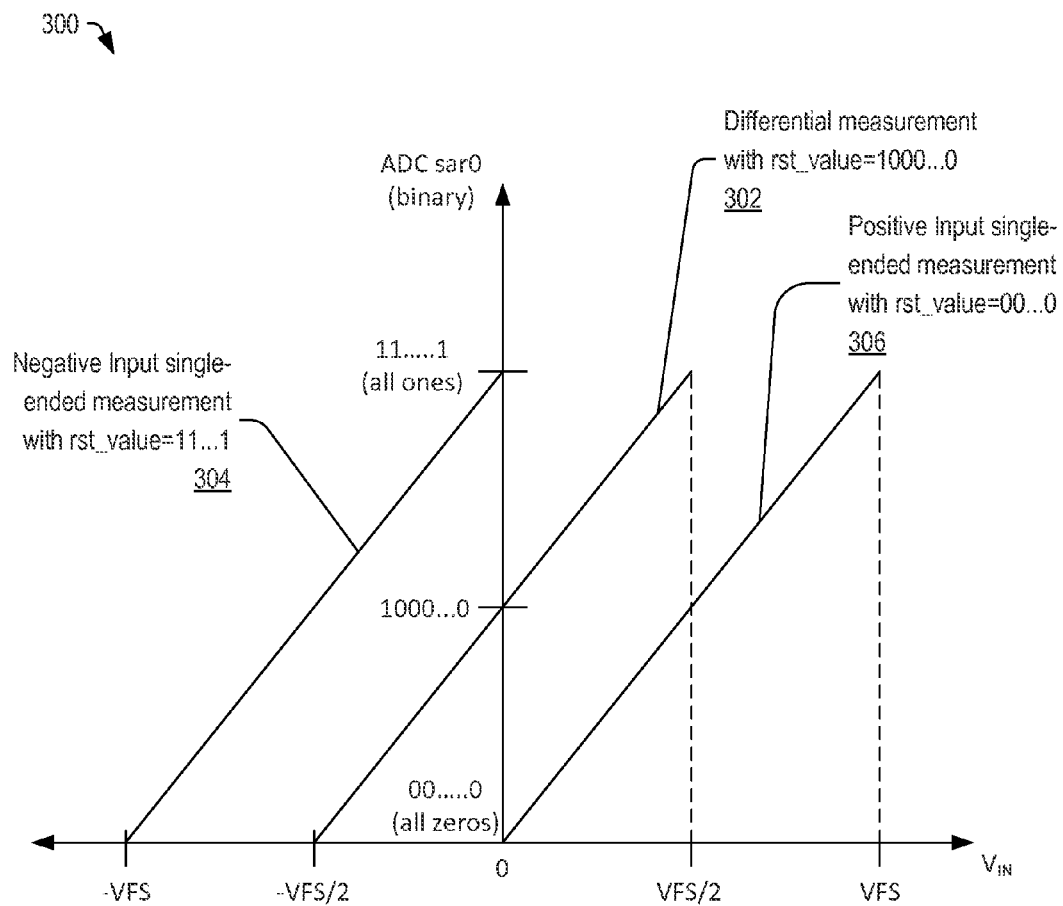
FIG. 3 is graph of the SAR ADC output versus input voltage depicting single-ended and differential conversion curves according to certain embodiments.

FIG. 3 is graph 300 of the SAR ADC output versus input voltage depicting single-ended and differential conversion curves according to certain embodiments. In a differential mode, a differential input signal may be provided at the input 104 and at the input 106, which signal may be sampled and held by the sample and hold circuit 102 and which signal may be provided to the inputs of the comparator 108 via the input nodes 212 and 232. In a differential mode, in certain embodiments, the SAR control circuit 260 may receive a reset value (rst_value[100 . . . 0]) and may digitally program the feedback DAC 116 to set the zero-crossing of the expected input range at zero volts at approximately a mid-point of the range, as indicated at 302.

In a negative-input single-ended mode, an input signal may be provided at the input 106, which signal may be captured by the sample and hold circuit 102, and which signal may be provided to the negative input (node 232) of the comparator 108. In a single-ended mode, in certain embodiments, the SAR control circuit 260 may receive a reset signal (rst_value [11 . . . 1]) and may digitally program the feedback DAC 116 to set the zero-crossing value at a level that is all ones at an end of the range, as indicated at 304.

In a positive-input single-ended mode, an input signal may be provided at the input 104, which signal may be captured by the sample and hold circuit 102, and which signal may be provided to the positive input (node 212) of the comparator 108. In a single-ended mode, in certain embodiments, the SAR control circuit 260 may receive a reset signal (rst_value [00 . . . 0]) and may digitally program the feedback DAC 116 to set the zero-crossing value at zero at a beginning of the range, as indicated at 306.

By configuring the capacitors 246, 248, 256, and 258 of the feedback DAC 116, the measurement range of the SAR ADC 100 or 200 may be shifted for single-ended negative or positive measurements or for a differential measurement, depending on the operating mode. By selectively programming the capacitors 246, 248, 256, and 258 of the feedback DAC 116, the SAR ADC 100 may provide the same input-range for differential and single-ended measurements while maintaining the SNR of the SAR ADC 100.

Figure 4:
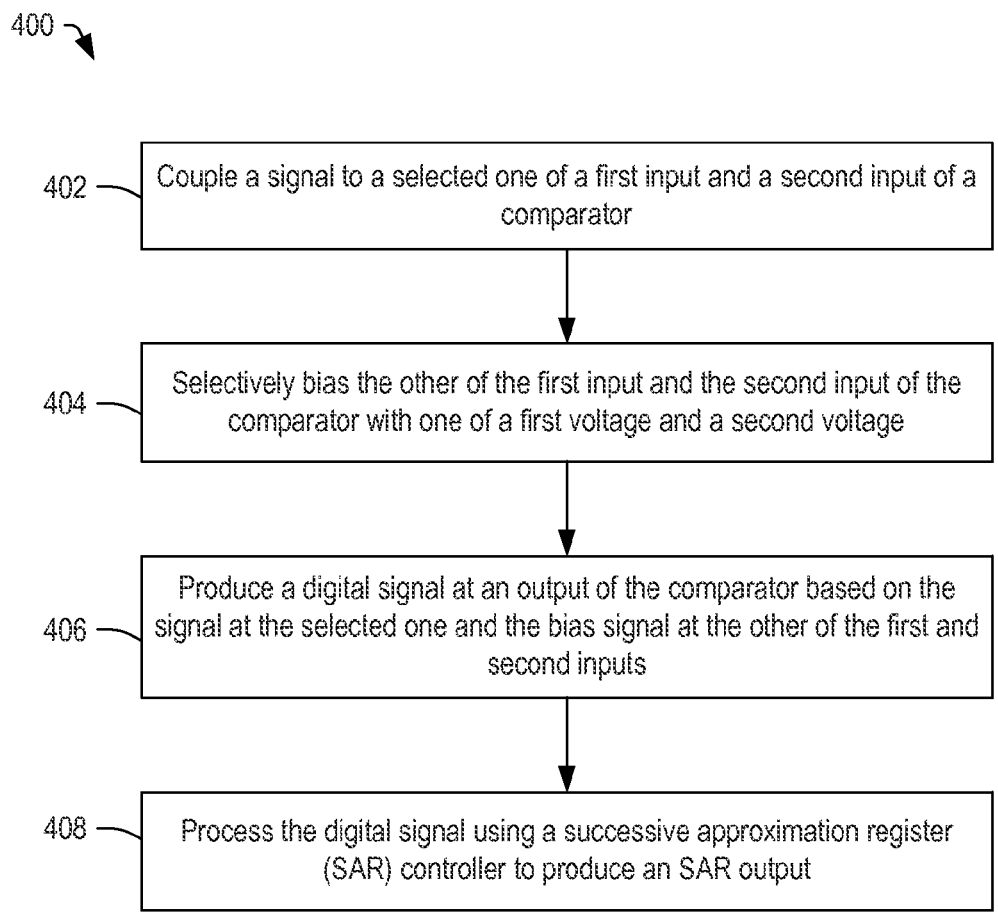
FIG. 4 is a flow diagram of a method of providing a single-ended measurement using an SAR ADC according to certain embodiments.

FIG. 4 is a flow diagram of a method 400 of providing a single-ended measurement using an SAR ADC according to certain embodiments. A signal may be coupled to a selected one of a first input and a second input of a comparator, at 402. In certain embodiments, the signal may be coupled to the selected one of the inputs by providing a control signal to a multiplexer circuit, which may include one or more multiplexers.

The other of the first input and the second input may be selectively biased with one of a first voltage and a second voltage, at 404. In a single-ended measurement using the negative input of the comparator, the positive input of the comparator may be biased using the built-in feedback DAC of the SAR. In a single-ended measurement using the positive input of the comparator, the negative input of the comparator may be biased using the built-in feedback DAC of the SAR.

A digital signal may be produced at an output of the comparator based on the signal at the selected one and the bias signal at the other of the first and second inputs, at 406. The comparator 108 may produce a digital output signal at the output 112, which may be provided to the SAR DAC 110. The digital output signal may be processed using the SAR controller 260 to produce an SAR output signal (saro) at the output 114.

Circuits and methods described above with respect to FIGS. 1-4 may provide an SAR ADC that may be configured to provide a single-ended measurement having an input voltage range that is substantially equal to that of a differential measurement with the same circuit. Further, the SAR ADC may be configured to provide the single-ended measurement of either positive or negative input signals without sacrificing SNR, relative to a differential measurement. Further, the circuits may be used with or without a multiplexer circuit to provide a signal to be measured.

Although the present invention has been described with reference to preferred embodiments, workers skilled in the art will recognize that changes may be made in form and detail without departing from the scope of the invention.

What is claimed is:

1. A circuit comprising:
a comparator including a first input, a second input, and an output; and
a successive approximation register (SAR) circuit coupled to the output of the comparator, the first input, and the second input, the SAR circuit configured to program one or more capacitors to selectively apply a bias signal to the first input and to provide a single-ended measurement of a voltage at the second input.

2. The circuit of claim 1, further comprising a sample circuit including:
a first output coupled to the first input; and
a second output coupled to the second input.

3. The circuit of claim 2, wherein the sample circuit comprises:
a first capacitor;
a first switch coupled between the first capacitor and the first output;
a second capacitor; and
a second switch coupled between the second capacitor and the second output.

4. The circuit of claim 1, wherein:
the first input comprises a positive input; and
the second input comprises a negative input.

5. The circuit of claim 4, wherein the SAR circuit programs the one or more capacitors to selectively bias the first input in a negative input single-ended measurement mode.

6. The circuit of claim 4, wherein the SAR circuit is configured to program the one or more capacitors to selectively bias the second input to provide a single-ended measurement of a voltage at the first input.

7. The circuit of claim 1, wherein the SAR circuit is configured to program one or more capacitors to selectively bias the first input and the second input to provide a differential measurement of voltages at the first input and the second input.

8. A method comprising:
in a first mode:
programming a first plurality of capacitors of a feedback digital-to-analog converter (DAC) of a successive approximation register (SAR) coupled to a first input of a comparator to apply a bias signal to the first input;
receiving a voltage at a second input of the comparator; and
comparing the voltage at the second input to the bias signal at the first input using the comparator to produce a digital output signal corresponding to a single-ended measurement of the voltage.

9. The method of claim 8, wherein the first mode comprises a negative input single-ended measurement mode.

10. The method of claim 8, further comprising:
in a second mode:
programming a second plurality of capacitors of the feedback DAC coupled to the second input of the comparator;
receiving a voltage at the first input of the comparator; and
comparing the voltage at the first input to a signal at the second input using the comparator to produce a digital output signal corresponding to a single-ended measurement of the voltage.

11. The method of claim 10, wherein the second mode comprises a positive input single-ended measurement mode.

12. The method of claim 8, further comprising:
in a third mode:
programming the first plurality of capacitors of the feedback DAC coupled to the first input of the comparator;
programming a second plurality of capacitors of the feedback DAC coupled to the second input of the comparator;
receiving a first voltage at the first input and a second voltage at the second input of the comparator; and
comparing the first voltage to the second voltage using the comparator to produce a digital output signal corresponding to a differential measurement.

13. The method of claim 8, wherein programming the first plurality of capacitors extends a measurement range of the comparator to encompass a measurement range that is approximately equal to a measurement range of a differential measurement.

14. A circuit comprising:
a comparator including a first input, a second input, and an output;
a feedback digital-to-analog converter (DAC) including a first plurality of capacitors coupled to the first input of the comparator and including a second plurality of capacitors coupled to the second input of the comparator the second input coupled to the first input; and
a successive approximation register (SAR) circuit coupled to the output of the comparator, the SAR circuit configured to program one or more capacitors of the feedback digital-to-analog converter (DAC) to apply a bias signal to a selected one of the first input and the second input to selectively provide a single-ended measurement mode by measuring an input signal at the other of the first input and the second input.

15. The circuit of claim 14, wherein, in a negative input single-ended measurement mode, the SAR circuit is configured to program one or more capacitors of the feedback DAC to bias the first input, and the comparator provides a digital signal corresponding to a measurement of a voltage on the second input.

16. The circuit of claim 14, wherein, in a positive input single-ended measurement mode, the SAR circuit is configured to program one or more capacitors of the feedback DAC to bias the second input, and the comparator provides a digital signal corresponding to a measurement of a voltage on the first input.

17. The circuit of claim 14, wherein, in a differential measurement mode, the SAR circuit is configured to program one or more capacitors of the feedback DAC to bias the first input and the second input.

18. The circuit of claim 14, in the single-ended measurement mode, the SAR circuit programs the one or more capacitors to extend a measurement range of the comparator to encompass a measurement range that is approximately equal to a measurement range of a differential measurement.

19. The circuit of claim 14, wherein the comparator produces a digital signal on the output that corresponds to a measurement of a voltage on at least one of the first input and the second input.

20. The circuit of claim 14, further comprising a sample circuit including:
   a first output coupled to the first input; and
   a second output coupled to the second input.

* * * * *